(12) United States Patent
Dragov

(10) Patent No.: US 6,792,784 B2
(45) Date of Patent: Sep. 21, 2004

(54) METHOD AND DEVICE FOR FOLDING OF RIBBON CABLES

(75) Inventor: Nikola Dragov, Maria Enzersdorf (AT)

(73) Assignee: I&T Flachleiter Produktions-Ges.m.b.H., Eisenstadt (AT)

(*) Notice: Subject to any disclaimer, the term of this patent is extended or adjusted under 35 U.S.C. 154(b) by 0 days.

(21) Appl. No.: 10/184,404

(22) Filed: Jun. 27, 2002

(65) Prior Publication Data
US 2003/0061712 A1 Apr. 3, 2003

(30) Foreign Application Priority Data
Jun. 27, 2001 (AT) ........................................ A 1002/2001

(51) Int. Cl.[7] ................................................. B21F 1/00
(52) U.S. Cl. ........................................... 72/220; 72/311
(58) Field of Search ....................... 72/220, 311; 29/868

(56) References Cited

U.S. PATENT DOCUMENTS

| | | | | |
|---|---|---|---|---|
| 4,510,785 A | * | 4/1985 | Triouleyre et al. ............ | 72/323 |
| 4,650,924 A | * | 3/1987 | Kauffman et al. ....... | 174/117 F |
| 4,658,090 A | * | 4/1987 | Coon ..................... | 174/119 R |
| 4,780,157 A | * | 10/1988 | Coon .......................... | 156/53 |
| 5,130,499 A | * | 7/1992 | Dijkshoorn ................. | 174/254 |

FOREIGN PATENT DOCUMENTS

| | | | | |
|---|---|---|---|---|
| GB | 2034102 | | 5/1980 | |
| JP | 07109066 A | * | 4/1995 | ........... B65H/45/12 |

* cited by examiner

Primary Examiner—Lowell A. Larson
(74) Attorney, Agent, or Firm—Merchant & Gould

(57) ABSTRACT

The ribbon cable being folded is fixed with a first end, called the fixed end, on a folding table and guided with another end, called the manipulated end, by a handling device. The handling device brings the manipulated end into the position that it is supposed to have after folding, and the loop formed in this position of the ribbon cable is smoothed out by a folding device.

3 Claims, 4 Drawing Sheets

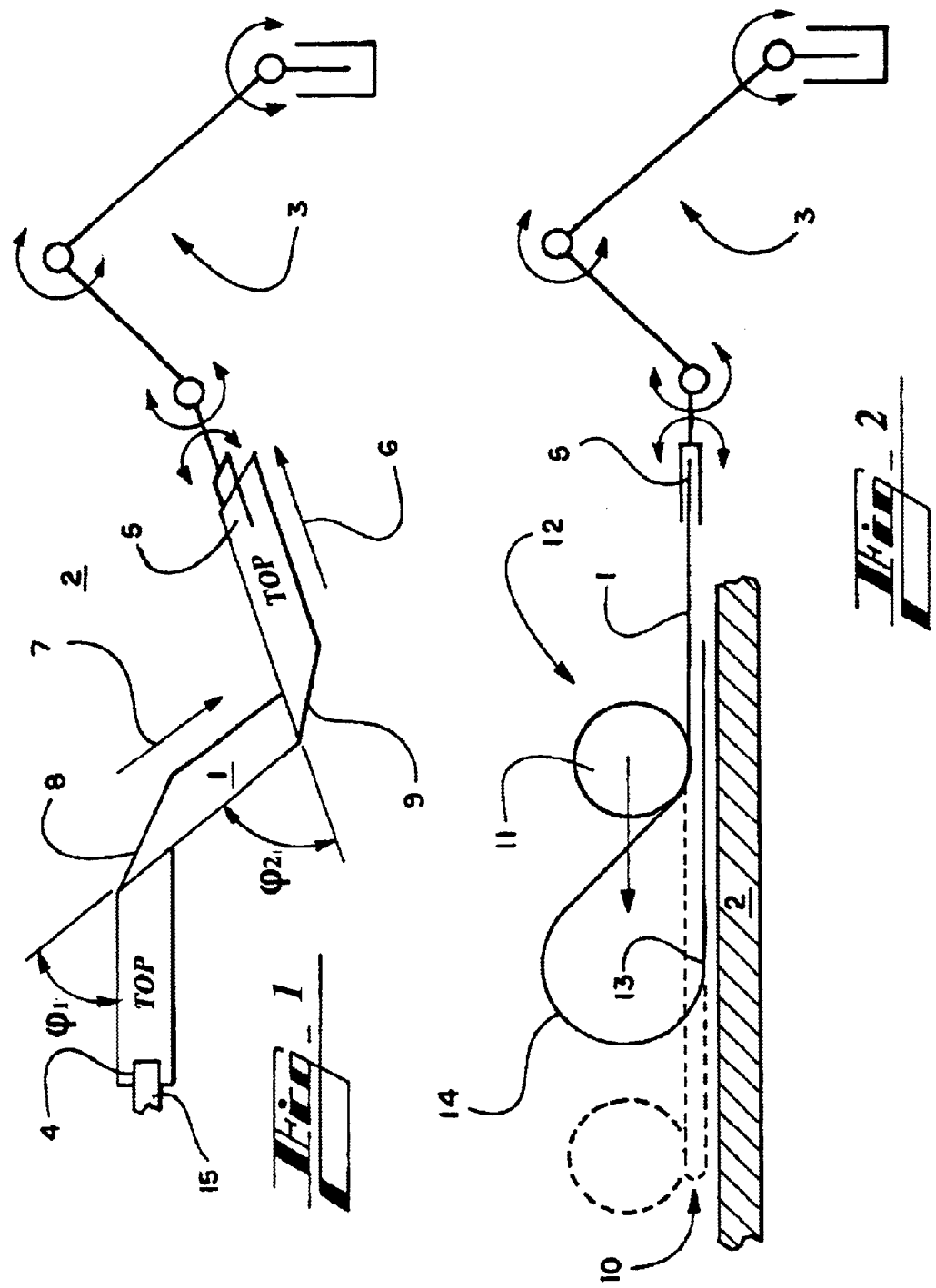

Figure 3:
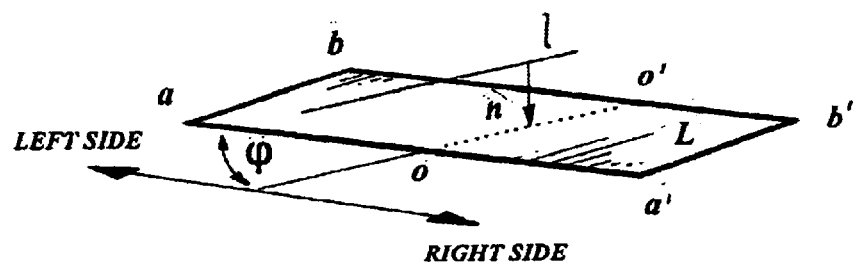

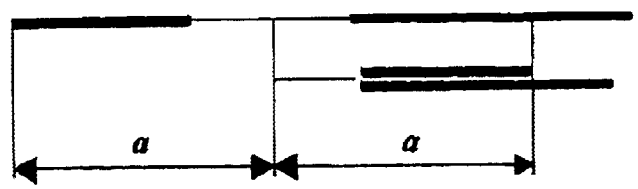
FIG_5
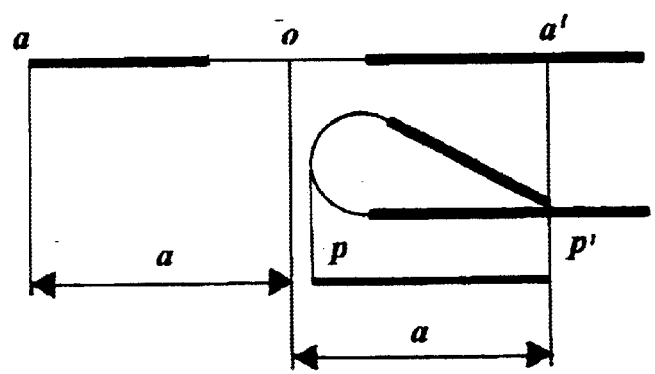
FIG_6
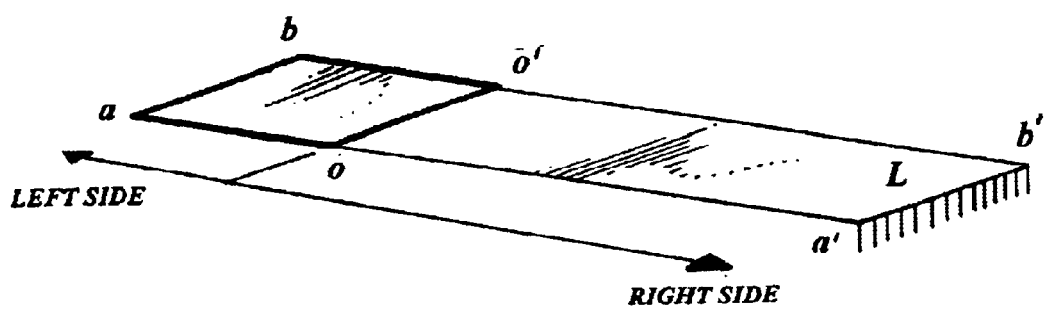
FIG_7

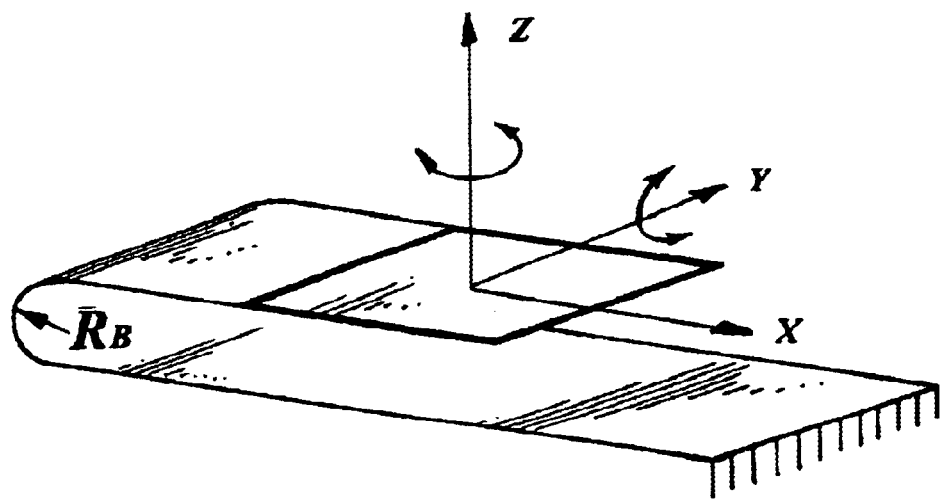
Fig_8
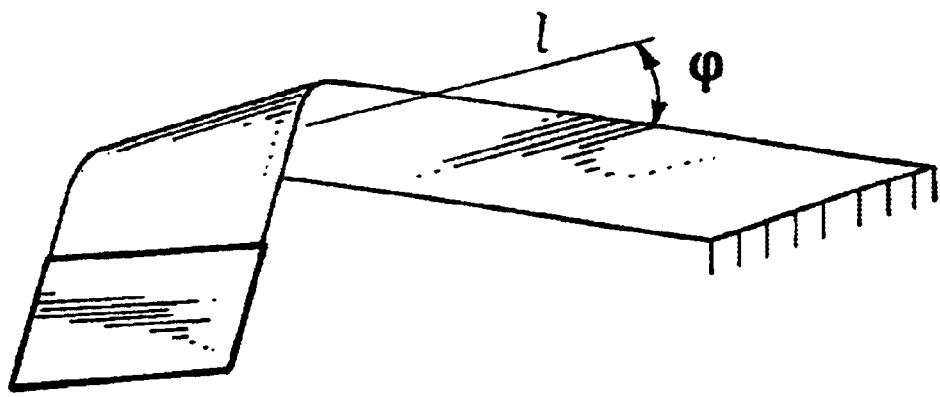
Fig_9

METHOD AND DEVICE FOR FOLDING OF RIBBON CABLES

FIELD OF THE INVENTION

The invention concerns a method and device for the folding of ribbon cables.

BACKGROUND OF THE INVENTION

Ribbon cables are known in the prior art and are increasingly used for different reasons in the automotive industry in the production of cable harnesses. Because of the strongly anisotropic mechanical properties of ribbon cables, bends and curves cannot be bent in the plane of ribbon cables (and naturally not in planes that include only a shallow angle relative to this plane). This is invariably necessary when a certain contour must be followed between the two ends of the ribbon cable (which ordinarily, but not necessarily, are provided with connectors).

It is then necessary to fold the ribbon cable so that a cable that essentially consists of a sequence of linear segments, in which adjacent segments are joined to each other by folding is obtained. It is inherent to the ribbon cable and this arrangement that the side of the ribbon cable that was the top (viewed geometrically) "before" folding is the bottom "after" folding. If this is not admissible for whatever reason, a connection (for example, welding) between two (generally positioned one on the other) cable sections must be created instead of folding.

Such folds have thus far been made by means of devices that have corresponding stops or the like at the site at which a ribbon cable is to be folded. This means that in repeatedly folded ribbon cables, and this is the case in most cables, since the different contours of the auto body of the vehicle in which the cable harness is used must be traced, a number of folding stations must be arranged with high accuracy on the folding table. However, this also means that, even with only slight changes in the dimensions or outline of the cable harness, the entire table must be rearranged, which is naturally demanding and expensive.

BRIEF SUMMARY OF THE INVENTION

The objective of the invention is therefore to devise a method and device of the type just mentioned that does not exhibit the mentioned shortcomings and can be rearranged and used cost-effectively for different cable harness sections of ribbon cables.

These objectives are achieved according to the invention in that the ribbon cable, with its first end, preferably already provided with the connector prescribed for this end, is brought into a predetermined initial position on the folding table and held in this position, for example, by means of a mating connector, a hold-down, or the like, that the other end of the ribbon cable, also preferably already provided with its connector prescribed for this end, is held and guided by a handling device, that an automatic handling device establishes the position and angular location of this end of the ribbon cable and, in the course of movement of this end, establishes the position change and stores it, and that a fold-forming device, preferably in the form of a roller, is arranged to be adjustable in height above the table and adjustable in position relative to the table, so that the position of the fold is defined by the geometric position of the two ends relative to each other and, with reference to the table and the fold, can be created with high accuracy by activation of the fold-forming device.

The table need not be flat, but can have a shape that enables it to form a ribbon cable so that it is reliably adapted to the curvature of a sunroof, a trunk, a door opening, etc.

The procedure according to the invention, in creating a corresponding section of the cable harness from a ribbon cable, is as follows: as already explained, the cable is first fastened to a predetermined point of the table with one end and held by a handling device with its other end, which is called the "manipulated" end. Due to knowledge of the instantaneous position of the manipulated end held by the handling device and knowledge of the final shape that the folded cable is to have, the computer belonging to the automatic handling device now calculates the position and angle of the first fold. It then rotates the manipulated end of the ribbon cable so that the transition from the top to the bottom of the cable is stipulated in the region of the fold; it brings the manipulated end of the ribbon cable into a position and angular position, in which this end must lie after the first fold is made.

By executing or creating this fold, the folding device now enters into action, preferably a roller This is placed close to the manipulated end on the ribbon cable and lolls away from the manipulated end to the site of the fold being formed. All bends and loops caused by the rigidity of the cable are smoothed out by this movement and the planned fold is produced by fixation of the ribbon cable in the correct end position at the predetermined site and with the predetermined angle.

The folding device is then raised from the table or remains in the fold region, preferably on the side of the fold facing away from the manipulated end of the ribbon cable, the automatic handling device brings the manipulated end of the ribbon cable into the location in position that it is supposed to have after formation of the second fold, and the folding device (or a second folding device, if the first is used for fixation of the first fold) again forms a fold, beginning in the region of the manipulated end.

It is naturally possible to provide two or more folding devices, in order to fix the regions lying between the ends during subsequent folding and to keep them in a predetermined position, especially in the long ribbon cables that must be folded frequently.

However, it is essential that the at least one folding device not be mounted in an unmovable manner, as in the prior art, at the location on the table prescribed for the fold, but that it be freely movable, just like the handling device for the manipulated end, by means of a computer and a corresponding electrical, pneumatic, or hydraulic drive device in the region of the table and thus to carry out, based on calculations of the computer, the corresponding movements over the table, in order to fold the cable situated between the table and the folding device. For adjustment to tolerances of any kind, the mentioned roller is preferred because it is then ensured that, in the first place, only the forces that are necessary for formation of the fold are transferred to the ribbon cable. It is naturally also possible to provide a type of flap or the like, through which the ribbon cable moves more or less simultaneously over a larger range of its length to the site of the desired fold and is folded there.

As is readily apparent from the explanation, it is an easy matter to create the different sections of a cable harness consisting of ribbon cables with the same table without rearrangement, since it is only necessary for this purpose that a different program be activated in the data processing unit for the handling device and the folding device. With respect to mechanical grasping of the cable end, it is an easy matter to create either a universal mount for the forms of the cable ends under consideration or coupling pieces that cooperate, on one end, with fixation on the folding table and fixation in the handling device and, on the other end, cooperate with corresponding cable ends, preferably the connectors already provided for final assembly. In this manner, with such intermediate pieces, it can also be ensured that the position of the cable end is always correctly recorded without having to perform complicated adjustment and calibration steps, since adjustment of small geometric differences or deviations can occur by the intermediate pieces used.

It is also essential that the individual errors of subsequent folds in the method according to the invention cannot be added in one direction since, during each fold, the manipulated end of the ribbon cable is held at the "correct" site with the stipulated accuracy, so that errors of the individual steps always balance each other out as best as possible.

Another advantage is that it becomes possible, with the method according to the invention, to connect the fold very tightly to an already existing fold, since no folding device fastened to the table hampers the folding process.

BRIEF DESCRIPTION FOR THE DRAWINGS

Figure 4:
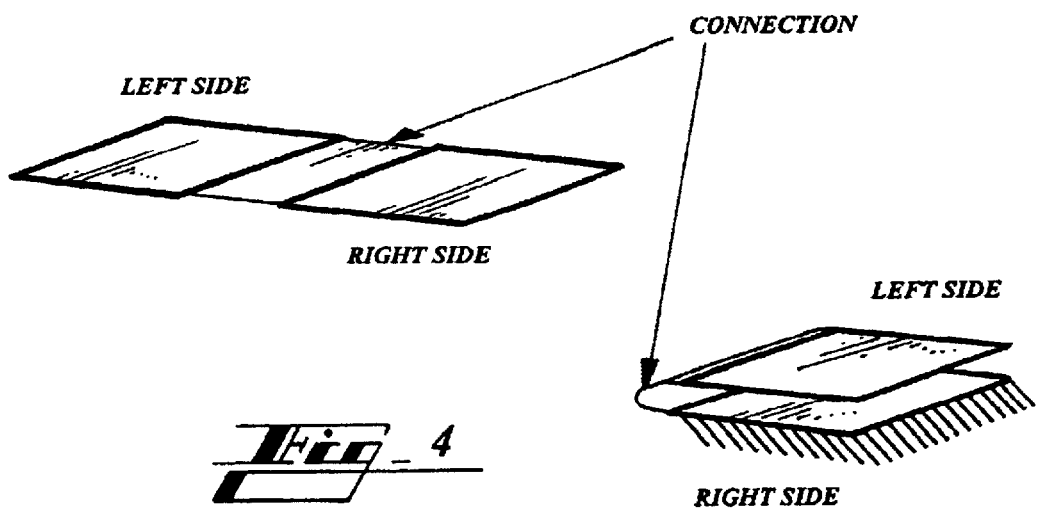

The invention is further explained below with reference to the drawings. In the drawings:

FIG. 1 shows a purely schematic top view of a folding table equipped according to the invention, FIG. 2 shows a purely schematic side view of a folding table equipped according to the invention, FIG. 3 shows a second view of an idealized ribbon cable to explain the theoretical fundamentals of the invention, FIG. 4 shows another view of an idealized ribbon cable section for an explanation of theoretical fundamentals of the invention, FIGS. 5 and 6 show details for consideration of the finite thickness of an ideal ribbon cable, and FIGS. 7 to 9 explain the procedure during determination of the parameters for a fold.

DETAILED DESCRIPTION OF THE PREFERRED EMBODIMENT

FIG. 1 purely schematically depicts a top view of a folding table 2, on which a ribbon cable guide 1 is situated and that is fixed with its one end in a holding device 15 (fixed end) and grasped with its other end by a handling device 3. This end grasped by the handling device is called the manipulated end below.

The double arrows in FIG. 1 in the region of the handling device 3 schematically indicate the degrees of freedom; arrows 7 and 6 show the advancing production of the cable harness section from the ribbon cable 1. φ1 and φ2 are the folding angles. It is also apparent and marked in FIG. 1 that the side of the ribbon cable 1 that is the top of the fixed end 4 becomes the bottom after the first fold, and again becomes the top after the second fold.

FIG. 2 shows a side view, partially in section and also purely schematically, in which the process of formation of the fold is apparent. The manipulated end 5 of ribbon cable 1 is situated in the stated position on or just above folding table 2. The fixed end of ribbon cable 1 is not shown; only the region that is found in the area of the fold 10 being formed, coming from this fixed end, is depicted. The direction of this section 13 of the ribbon cable 1 is stipulated either in the case of the first fold 8 (FIG. 1) by the fixed end 4 or by the immediately preceding fold in the region of any additional fold 9 (FIG. 1).

If the manipulated end 5 is now found in the position in which it is supposed to be after the creation of fold 10, it is possible to create the fold 10 in the correct position of ribbon cable 1 without having to provide a fixed folding device on table 2 in this region by simple rolling or grazing the ribbon cable section, having the spacing of the fold 10 being produced, section 13, on the one hand, and the section adjacent to the manipulated end 5, on the other. The moving folding device 12 used according to the invention preferably consists of a roller 11 that can have the shape of a disk or the like and that, after the handling device 3 has moved the manipulated end 5 into the correct position, rolls out the ribbon cable 1 from the region of this manipulated end and thus produces the desired fold 10 by compression from the original loop 14.

It is readily apparent from the cohesion of FIGS. 1 and 2 that it is naturally possible to carry out a subsequent fold, then to use an additional folding device (not shown), and to leave the depicted roller 11 in its end position, depicted with the dashed line, in order to prevent, especially when several folds are to occur in succession, the already folded region of the ribbon cable 1 from being elastically or plastically deformed, so that it deviates from the stipulated final shape. It is also possible to operate the same folding device and use it again for the next fold and, in that case, to fix the already formed fold(s), or at least the last one, by a simple holding device, for example, a punch.

The folding device 12 in this description is presented and designated as a roller or disk, but it is naturally possible to use a folding blade instead of this, which is guided to slide over loop 14 and causes it to fold. It is also possible to use a type of flap or cradle that rotates about an axis or is moved along a path and thus forces down the loop. The roller is preferred, because of its simple design and the mild handling of the ribbon cable.

The theoretical fundamentals for the execution of folding and for calculation and establishment of the program, through which the handling device 3 and the folding device 12 are controlled, are apparent from FIGS. 3 to 9. FIG. 3 shows a cutout or a region of a ribbon cable that is considered, for the basic calculations and determinations of the process, as a flat solid with infinitely small thickness. Because of this, the following geometric relations are defined: a'–b'a–a'//b–b' and a–o=o–a'b–o'>o'–b'.

A line that encloses an arbitrarily selected angle φ with the long edge of the ribbon cable is defined by o and o'. If a line 1 is now defined, which lies by spacing b parallel to the plane 1 defined by the ribbon cable surface and precisely above points o and o', the construct apparent from FIG. 3 is obtained.

For further consideration, it is assumed that, to the left and right of the line formed by points o, o', the ribbon cable is considered to be plastic, whereas the regions lying farther away are considered to be rigid. This is shown in FIG. 4 by the thick lines that delimit the parts imagined to be rigid and the thin lines that delimit the part considered to be plastic.

As a whole, the rigid body has 6 degrees of freedom. If one of the two rigid parts is stretched, the degree of freedom defined by the plastic connection still remains for the other part, namely, rotation about an axis determined by the plastic connection. Such bending or folding is schematically shown in the right part of FIG. 4.

However, in reality, a finite thickness of the ribbon cable must be considered and therefore a finite radius of curvature of the fold must also be used as a basis, if one refers to the comments just made to the center plane of the ribbon cable, which, in most cases, is designed to be symmetric. FIGS. 5 and 6 show, as a comparison, the differences stemming from the finite radius. These differences, in the context in which they are relevant for the invention, are a shortening of the ribbon cable from length A, as shown in FIG. 5, to the length p-p', as shown in FIG. 6. This difference can be easily determined either by experiments or calculation methods, with which this difference is determined from the geometry of the fold and the plastic deformation of the ribbon cable in the thinly marked region in the figures.

A complete performance of the bend is apparent in a purely schematic oblique view from FIGS. 7, 8, and 9. The end of the ribbon cable strip with the shading then represents the fixed end and the region aboo' bounded by the thick lines represents the manipulated end In FIG. 7, the initial position, for reasons of clarity and because the sketch is used for theoretical explanations, is shown without the handling device; FIG. 8 shows the layout of an intermediate situation, in which the manipulated end comes to lie above the ribbon cable section coming from the fixed end, and FIG. 9 finally represents the final situation, in which the manipulated end assumes the desired end position and the ribbon cable is bent around bending line 1.

As follows from the aforestated, the bending line 1 is not materialized anywhere on the table by a fold or the like and, at the predetermined site, is obtained by corresponding positioning of the fixed end and the manipulated end, then rolling out, smoothing, or pressing down of the ribbon cable.

In the description, it was always described that rolling out of the manipulated end occurs. The reason for this is that each fold leads to a 180° rotation of the ribbon cable about its longitudinal axis. This rotation is now executed by the manipulated end and the loop is therefore situated in this end region at a certain spacing from the table surface and can be rolled out. In the region of the ribbon cable adjacent to the fixed end (or the preceding fold), the ribbon cable is in contact with the table, or at least in its immediate vicinity, and requires no plastic deformation.

What is claimed is:

1. Method for the folding of ribbon cables, comprising the steps of:

fixing at a predetermined position on a folding table a first end of a ribbon cable to be folded;

using a handling device to manipulate a second end of the ribbon cable to form a loop in the ribbon cable while moving the second end into another predetermined position that the second end will occupy after folding the ribbon cable; and then using a folding device to smooth the loop formed in the ribbon cable.

2. The method as in claim 1, comprising the further steps, after folding, of removing the folding device from the region of the fold;

using a holding device to fix the fold to the table, so that the fold therefore becomes another fixed end; and then repeating the steps of claim 1 at least one time.

3. Apparatus for performing the method according to claim 1, comprising a folding table having at least one fixation device for the first end of a ribbon cable, a handling device operable to selectably engage the second end of the ribbon cable, and a folding device in predetermined movable relation to the folding table and movable by at least one automatic handling device.

* * * * *